(12) United States Patent
Jain et al.

(10) Patent No.: US 9,543,044 B2
(45) Date of Patent: Jan. 10, 2017

(54) SYSTEM AND METHOD FOR IMPROVING MEMORY PERFORMANCE AND IDENTIFYING WEAK BITS

(71) Applicants: STMicroelectronics International N.V., Amsterdam (NL); STMicroelectronics S.R.L., Agrate Brainza (IT)

(72) Inventors: Abhishek Jain, Delhi (IN); Andrea Mario Veggetti, Agrate Brianza (IT); Amit Chhabra, Delhi (IN)

(73) Assignees: STMicroelectronics International N.V., Amsterdam (NL); STMicroelectronics S.R.L., Agrate Brianza (MB) (IT)

( * ) Notice: Subject to any disclaimer, the term of this patent is extended or adjusted under 35 U.S.C. 154(b) by 427 days.

(21) Appl. No.: 14/074,341

(22) Filed: Nov. 7, 2013

(65) Prior Publication Data

US 2015/0127998 A1    May 7, 2015

(51) Int. Cl.
| | | |
|---|---|---|
| *G11C 29/48* | (2006.01) | |
| *G06F 1/08* | (2006.01) | |
| *G11C 29/24* | (2006.01) | |
| *G11C 29/52* | (2006.01) | |
| *G11C 29/54* | (2006.01) | |

(52) U.S. Cl.
CPC ............. *G11C 29/48* (2013.01); *G06F 1/08* (2013.01); *G11C 29/24* (2013.01); *G11C 29/52* (2013.01)

(58) Field of Classification Search
CPC ......... G11C 29/48; G11C 29/24; G11C 29/52; G06F 1/08
See application file for complete search history.

(56) References Cited

U.S. PATENT DOCUMENTS

| | | | | |
|---|---|---|---|---|
| 4,726,022 | A * | 2/1988 | Chan et al. | 714/704 |
| 5,220,651 | A * | 6/1993 | Larson | 710/8 |
| 5,383,195 | A * | 1/1995 | Spence et al. | 714/733 |
| 5,594,681 | A * | 1/1997 | Taguchi | 365/149 |
| 5,657,292 | A * | 8/1997 | McClure | 365/233.16 |
| 6,158,028 | A * | 12/2000 | Imura | 714/718 |
| 6,237,115 | B1 * | 5/2001 | Ting et al. | 714/718 |
| 6,496,947 | B1 * | 12/2002 | Schwarz | 714/30 |
| 6,603,694 | B1 * | 8/2003 | Frankowsky et al. | 365/222 |
| 6,667,917 | B1 * | 12/2003 | Templeton et al. | 365/201 |
| 2001/0048630 | A1 * | 12/2001 | Fujimoto et al. | 365/230.03 |
| 2002/0023238 | A1 * | 2/2002 | Yamada et al. | 713/400 |
| 2003/0031051 | A1 * | 2/2003 | Yen | 365/185.09 |

(Continued)

OTHER PUBLICATIONS

Li, J., "Chapter 4: Memory Built-In Self-Test," Department of Electrical Engineering, National Central University, Jhongli, Taiwan, Mar. 26, 2011, 52 pages.

*Primary Examiner* — April Y Blair
*Assistant Examiner* — Dipakkumar Gandhi
(74) *Attorney, Agent, or Firm* — Slater Matsil, LLP

(57) ABSTRACT

According to an embodiment described herein, a method for testing a memory includes receiving an address and a start signal at a memory, and generating a first detector pulse at a test circuit in response to the start signal. The first detector pulse has a leading edge and a trailing edge. A data transition of a bit associated with the address is detected. The bit is a functional bit. The method further includes determining whether the bit is a weak bit by determining whether the data transition occurred after the trailing edge.

28 Claims, 16 Drawing Sheets

(56) References Cited

U.S. PATENT DOCUMENTS

2003/0204797 A1* 10/2003 Lin .............................. 714/718
2014/0189433 A1* 7/2014 Schoenborn ........... G11C 29/06
                                                                       714/42

\* cited by examiner

*Access Time Waveforms*

|     | Dx | . | . | D2 | D1 | D0 |
|-----|----|---|---|----|----|----|
| A0  | 0  | 1 | 0 | 1  | 0  | 1  |
| A1  | 1  | 0 | 1 | 0  | 1  | 0  |
| A2  | 0  | 1 | 0 | 1  | 0  | 1  |
| A3  | 1  | 0 | 1 | 0  | 1  | 0  |
| .   | 0  | 1 | 0 | 1  | 0  | 1  |
| .   | 1  | 0 | 1 | 0  | 1  | 0  |
| .   | 0  | 1 | 0 | 1  | 0  | 1  |
| An  | 1  | 0 | 1 | 0  | 1  | 0  |

SYSTEM AND METHOD FOR IMPROVING MEMORY PERFORMANCE AND IDENTIFYING WEAK BITS

TECHNICAL FIELD

The present invention relates generally to memory systems, and, in particular embodiments, to a system and method for improving memory performance and identifying weak bits.

BACKGROUND

Many electronic systems can be divided into two categories: processing and data. Data are stored in memory for access in order to be used in processing or interactions with other systems or users. Performance of an electronic system is often related to the performance of the memory incorporated into the system.

In electronic systems, the most common types of memory used are flash memory, dynamic random-access memory (DRAM), static random-access memory (SRAM), and magnetic hard disk drive (HDD), although there are numerous other types and variations. Flash memory is composed of special transistors having a floating gate that is insulated and can store a charge. A DRAM element is usually composed of a transistor coupled to a capacitor that is dynamically refreshed to maintain a charge level. An SRAM element is usually composed of a number of transistors coupled together in a configuration operable to selectively couple outputs to either ground (VSS) or a high voltage node (VDD). A magnetic HDD is composed of magnetic disks with polarized magnetic bits being read or written as the disks spin at a high speed. Generally, each memory element has two states that can be read from and written to in order to serve as a memory bit.

Usually, important characteristics of a memory system may include read and write speed, reliability, and power consumption, among others. In many instances, system timing and operation speed are a key specification and memory plays an important role in determining what timing and operation speed may be used. Further, manufacturing of various types of memory systems usually introduces some amount of variation in performance. Such variations may result in decreased memory performance and increased cost as the manufacturer or customer characterizes and/or improves the performance of the manufactured memory systems.

SUMMARY OF THE INVENTION

According to an embodiment described herein, a method for testing a memory comprises receiving an address and a start signal at a memory, and generating a first detector pulse at a test circuit in response to the start signal. The first detector pulse has a leading edge and a trailing edge. A data transition of a bit associated with the address is detected. The bit is a functional bit. The method further includes determining whether the bit is a weak bit by determining whether the data transition occurred after the trailing edge.

In an embodiment, a circuit includes a transition detector configured to be coupled to a data output bus of a memory. The transition detector is configured to detect a transition on any data output bit of the data output bus. The circuit also includes a clock generator circuit configured to provide a plurality of pulses of different pulse width to the transition detector. In such embodiments, the transition detector is configured to provide an output signal corresponding to a specific data output bit when a transition is detected on the specific data output bit during a pulse provided by the clock generator circuit.

In various embodiments, a method for testing a memory comprises providing a first memory clock edge to the memory, and generating a first pulse having a leading edge and a trailing edge in response to the first memory clock edge. The first memory clock edge causes the memory to start writing a data value at a write address within the memory. The method further includes providing a second memory clock edge to the memory after the trailing edge. The second memory clock edge causes the memory to start reading the data value from the write address within the memory. A weak bit is identified at the write address after reading the data value from the write address.

In another embodiment, a memory system includes a main memory comprising functional bits and nonfunctional bits, the functional bits including weak bits, and a redundant memory. The memory system is configured to write and read to and from a remapped address in the redundant memory when a write or read command is directed at an address in the main memory with an identified weak bit.

In a further embodiment, a method for identifying at least one weakest bit of a plurality of weak bits in a memory, the method comprises providing the memory comprising functional bits and nonfunctional bits, the functional bits comprising the plurality of weak bits and applying a first plurality of pulses having a first pulse width to consecutively perform a test operation on each address in the memory and identifying an address in the memory with at least one first weak bit of the plurality of weak bits. The test operation identifies an address as having the at least one first weak bit based on whether a data transition on an output of the memory is detected during a read operation after the duration of the first pulse width. The method also includes applying a second plurality of pulses having a second pulse width to consecutively perform the test operation on each address in the memory and identifying an address in the memory with at least one second weak bit of the plurality of weak bits. The test operation identifies an address as having the at least one second weak bit based on whether a data transition on an output of the memory is detected during a read operation after the duration of the second pulse width. The method further includes identifying the at least one weakest bit from the at least one first weak bit. In such an embodiment, the first pulse width is longer than the second pulse width.

BRIEF DESCRIPTION OF THE DRAWINGS

For a more complete understanding of the present invention, and the advantages thereof, reference is now made to the following descriptions taken in conjunction with the accompanying drawing, in which.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

Figure 1:
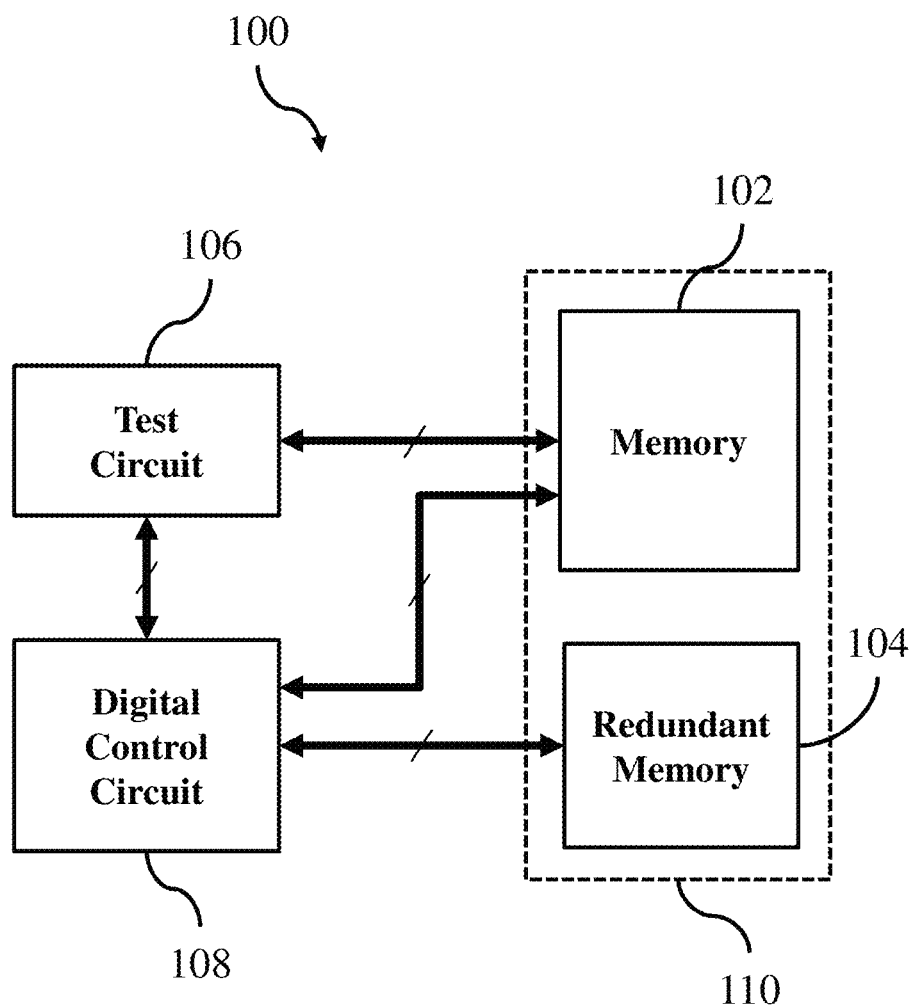
FIG. 1 illustrates a block diagram of an embodiment memory system.

The making and using of various embodiments are discussed in detail below. It should be appreciated, however, that the various embodiments described herein are applicable in a wide variety of specific contexts. The specific embodiments discussed are merely illustrative of specific ways to make and use various embodiments, and should not be construed in a limited scope.

Description is made with respect to various embodiments in a specific context, namely memory systems, and more particularly, characterizing memory systems. Some of the various embodiments described herein include methods of identifying weak bits and/or the weakest bits in a memory system, using a redundant memory to replace addresses with weak bits, performing timing tests according to various methods, and characterizing the performance of the memory, especially in terms of data access time. In other embodiments, aspects may also be applied to other applications involving any type of memory system according to any fashion as known in the art.

In the context of memory systems, numerous metrics may be used to characterize the memory system. Testing the memory system during the manufacturing process is commonplace for improving and ensuring product quality and performance. As such, many memory systems include a built-in self-test (BIST) unit in order to perform automated testing. A BIST unit may be used to identify functional bits and non-functional bits. Functional bits are bits within the memory that meet performance requirements for read and write time and successfully store data. Non-functional bits are bits that fail one or more functional tests and are inoperable in regular function. In some memory systems, addresses with non-functional bits may be remapped to a redundant memory in order to salvage the memory system.

Conventionally, a BIST unit may perform a number of tests in order to identify non-functional bits. Specific failures causing non-functional bits may include stuck-at faults, transition faults, address-decoder faults, stuck-open faults, coupling faults, disturb faults, data retention faults, and others. In other words, these functional faults occur when memory cells do not effectively and consistently store, read, or erase accessible values. For example, a memory cell is coupled to another memory cell so that changing one cell affects the other cell, a memory cell takes on a specific value and will not change, a memory cell changes value over time without being written to, a memory cell changes value when read from, a memory cell with a certain address is not accessed by that address or multiple cells have the same address, or others.

Another category of bits includes weak bits, which are electrically weak. In various embodiments, electrically weak bits may pass functional tests at higher voltages, but fail at lower voltages. Similarly, weak bits may pass at higher temperatures in a fresh lot, but may fail at lower temperatures and/or after ageing, for example. These bits may be sensitive to variations in the operation environment such as, for example, variations in voltage and/or temperature. Weak bits are functional bits that have slower access times or other adverse characteristics. Weak bits may pass all the functional tests of a BIST unit, and therefore are free of the various functional failures listed above, but remain prone to failure during product lifetime and in specific usage environments thereby degrading memory system reliability and performance. For example, a large fraction of the weak bits may fail during product usage. Examples of some physical effects that may result in electrical failure include negative bias temperature instability (NBTI), time dependent dielectric breakdown (TDDB), hot carrier injection, electromigration, and others. In various contexts, a test escape may refer to a weak bit and/or a non-functional bit that is unidentified and uncorrected following a test and characterization process. Test escapes of non-functional bits may be less common since they will fail at all voltage and temperature conditions, but test escapes of weak bits may be more common due to the difficulty in identifying weak bits, particularly during electrical wafer sort (EWS) stage. This problem may be exacerbated due to the time dependent nature of many of these physical effects that may cause failures.

In a specific example, weak bits may be relevant especially in the context of local variations of a memory system. Local variations are variations to specific memory cells in a memory different from the variations of other cells. For example, in an SRAM cell, physical variations may produce variations in the cell current $I_{cell}$ during read operations, and write time during write operations (due to variation in threshold voltage $V_T$ of the pull-up transistor), and the minimum operating voltage ($V_{min}$) required by the memory cell. These variations are exacerbated by the rapidly shrinking physical size of memory cells in modern memory systems, along with exponential increase in on-chip memory capacity with advancements in each technology node. Such local variations may cause specific memory cells to be more likely to fail during operation or in specific usage environments, and it is these memory cells that are referred to as weak bits. Current characterization and test sequences performed on memory systems are insufficient for identifying weak bits and allow a detrimental number of test escapes during functional testing.

According to various embodiments described herein, a memory system is capable of identifying weak bits by performing various self-tests. Self-tests may be performed on each memory address and all data output bits may be monitored simultaneously to detect a weak bit. The weak bits may be remapped to a redundant memory once identified. Detecting such weak bits enables the memory system to operate at its full potential. Advantageously, the self-tests may be performed at the time of factory testing and/or during product usage.

A memory system implementing embodiments of the present invention to identify weak bits will be described in FIG. 1. A timing diagram of a read test will be described in FIG. 2. A detailed block diagram of an embodiment memory system and especially a test circuit will be described in FIG. 3. A flowchart diagram of a read test will be described in FIG. 4. A timing diagram of a read-after-write test will be described in FIG. 5. Flowchart diagrams of a read-after-write test will be described in FIGS. 6a-6b. A more detailed block diagram of an embodiment memory system and especially a test circuit will be described in FIG. 7. In FIG. 8, a block diagram of a clock generation circuit will be described. A table of test values having a checkerboard pattern will be described in FIG. 9. A control circuit and memory system with a BIST controller will be described in FIG. 10. In FIG. 11, an alternative memory system having a programmable delay generator will be described. An alternative embodiment memory system with further detail will be described in FIG. 12. An additional memory system with buffering on an output data line of the memory will be described in FIG. 13. In FIGS. 14a-14c, methods of performing a read test, a read-after-write test, and an additional read-after-write test will be described, respectively. A method of performing a fast read test will be described in FIG. 15.

FIG. 1 illustrates a block diagram of an embodiment memory system 100 that includes a memory 102, a redundant memory 104, a test circuit 106, and a digital control circuit 108. According to various embodiments, memory 102 may be a main memory for a system and may include DRAM, Flash, SRAM, an HDD, or any other type of memory. Redundant memory 104 may be a same memory type as the memory 102 or any other memory type. Memory 102 and redundant memory 104 may be combined to form a new effective memory 110.

According to various embodiments, digital control circuit 108 is coupled to memory 102, redundant memory 104, and test circuit 106 via multi-bit bus lines. Digital control circuit 108 may provide control signals to test circuit 106 during operation and during a memory characterization sequence. Control signals may include memory addresses, mode select signals, and various enables. Digital control circuit 108 may also be coupled with both memories 102 and 104, and test circuit 106 may be coupled to memory 102 via a multi-bit bus line. In various embodiments, digital control circuit 108 includes a memory BIST and additional digital logic. The memory BIST and digital logic may be implemented as a custom IC or as a combination of supplied components and glue logic. In other embodiments, the memory BIST and digital logic in digital control circuit 108 may include a microprocessor, FPGA, test sequence ROM, or any combination of such or similar components, as is known in the art.

In various embodiments, digital control circuit 108 and test circuit 106 are configured to test or characterize memory 102. In such cases, characterizing memory 102 may include identifying weak bits within memory 102 by performing a series of tests to identify weak bits at specific addresses within memory 102. In one embodiment, digital control circuit 108 may provide an address and various control signals to test 106 in order to perform a read test. The read test performs a read operation on the specified address within memory 102 and simultaneously creates a pulse of a specific pulse width while monitoring all data outputs of memory 102. Test circuit 106 provides a flag that indicates if a weak bit has been identified. In further specific embodiments, the series of tests may identify the weakest bit or bits in memory 102, i.e. the bit or bits in memory with the slowest transition during a read operation.

In a specific embodiment, a weak bit is identified by monitoring the data outputs of memory 102 after a read command is issued in order to detect data transitions. Detected data transitions are compared against the pulse created simultaneously to beginning the read operation in order to determine if the transition occurs during the pulse or after the pulse. According to various embodiments, if a single transition occurs after the pulse and all other data transitions occur during the pulse, a weak bit is identified. In some embodiments, if multiple data transitions occur after the pulse, a weak bit is not identified because multiple transitions indicate a system limit and not a single weak bit.

Such read tests may be performed for every address in memory 102 in order to identify any weak bits within memory 102. In other embodiments, the weakest bit or bits in all of memory 102 may be identified during a read test. In some embodiments, addresses with identified weak bits are remapped to addresses in the redundant memory by digital control block 108.

Figure 2:
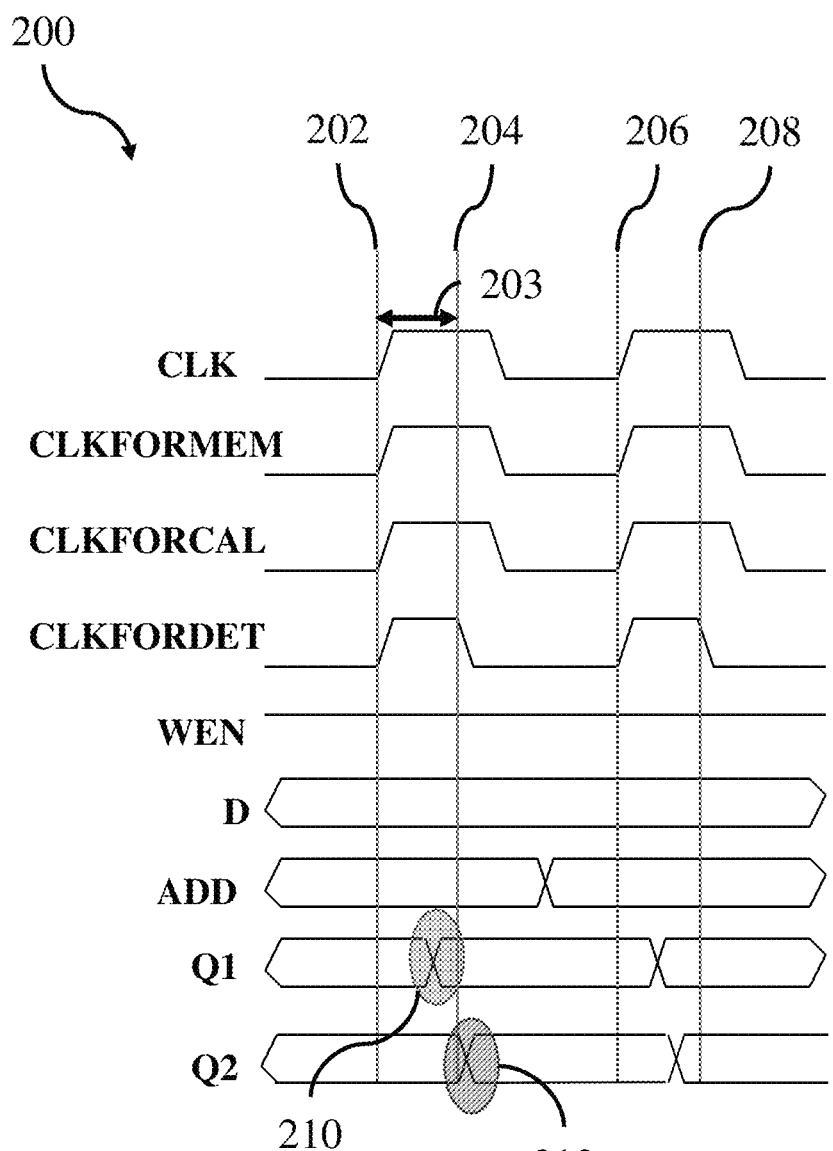
FIG. 2 illustrates a timing diagram of an embodiment method of characterizing a memory.

FIG. 2 illustrates a timing diagram 200 of an embodiment method of characterizing a memory according to a read test. The read test includes a start signal 202. In some embodiments, start signal 202 may be a common clock edge. Timing diagram 200 depicts a system clock CLK, a memory clock CLKFORMEM, calibration clock CLKFORCAL, and a detection clock CLKFORDET. The pulse used for the read test is provided by CLKFORDET. The other clock signals CLKFORMEM and CLKFORCAL may be identical to CLK during a read test. All the clock signals apart from system clock CLK are provided by a programmable delay generator or a clock generator circuit which will be described below. Detection clock CLKFORDET may be controlled to have pulse widths of different pulse durations.

According to the embodiment illustrated in FIG. 2, timing diagram 200 depicts detection clock CLKFORDET having a first pulse with a first pulse width 203 between start signal 202 and falling edge 204. Write enable WEN is an active low signal and is depicted as enabling read mode in timing diagram 200. Data input D is depicted as unchanging and is not used in timing diagram 200. Address ADD specifies which address in memory 102 to access and is depicted as an arbitrary address that is changed for a second read test beginning with second start signal 206.

Data outputs Q1 and Q2 depict data lines from memory 102 including data transitions 210 and 212. As shown, Q1 includes a data output transition 210 occurring during the first pulse of the detection clock CLKFORDET, i.e. between start signal 202 and falling edge 204, and indicates correct data transitions. Q2 includes a data output transition 212 after the first pulse and indicates a failed data transition. In various embodiments, Q1 and Q2 are part of an output data bus Q that includes many data bits Q1-Qn, where the size of data output bus Q may take any value n. For example, data output bus Q may be a 32-bit bus, 64-bit bus, 128-bit bus, 256-bit bus, or any other size bus.

Embodiments of the present invention may also be applied using asynchronous systems, for example, when the clock signal and the pulse signals do not start at the same time. In some embodiments, first pulse width 203 may be defined as the duration between start signal 202 and falling edge 204. Start signal 202 may initiate a read operation and falling edge 204 may occur a first time period after start signal 202. In such embodiments, a failed data transition is a data transition occurring after falling edge 204. Failed data transitions may indicate a weak bit or weak bits. Thus, a read operation may be performed and the outputs of the memory may be monitored for transitions. Transitions occurring after the first time period may be detected as failed data transitions and/or weak bits. The first time period may or may not include an actual signal pulse and, if included, the pulse may start before, at, or after start signal 202.

According to various embodiments, correct data transitions may include all data outputs that transition during the first pulse and failed data transitions may include all the data outputs that transition after the first pulse. In some embodiments, a weak bit is identified when only a single bit of the n bits transitions after the first pulse and the other n−1 bits transition during the first pulse. In one specific embodiment, a weak bit is identified if only a single bit in the entire memory transitions after the first pulse. In another embodiment, weak bits are identified if a small number of bits in the entire memory transition after the first pulse. In such an embodiment, only the weakest bits in the memory are identified and may be remapped to a redundant memory. For example, if less than 5, less than 10, or less than 100 bits transition after the first pulse, those bits are identified as weak bits. In other embodiments, all addresses with slow transitions indicated by failed data output transitions may be stored and compared in order to identify weak bits.

As shown in FIG. 2, timing diagram 200 includes a second read test beginning with second start signal 206, the read test being performed at a second read address. In some embodiments, a second pulse between second start signal 206 and second falling edge 208 has a second pulse width equal to the first pulse width 203. In other embodiments, the second pulse has a second pulse width different from pulse width 203. In a specific embodiment, the second pulse width is less than the first pulse width, i.e. shorter in duration. For example, if all bits at a given address pass a read test with a first pulse width, it may be beneficial to perform a second read test with a second pulse width with shortened duration in order to further characterize the memory address and identify undiscovered weak bits. In the embodiment shown, both data outputs include correct transitions during the second pulse. In other embodiments, the second pulse width comprises a second time period between second start signal 206 and second falling edge 208. The second time period may or may not correspond to an actual pulse, but indicates a time between a start signal and a time threshold for determining failed data transitions.

Figure 3:
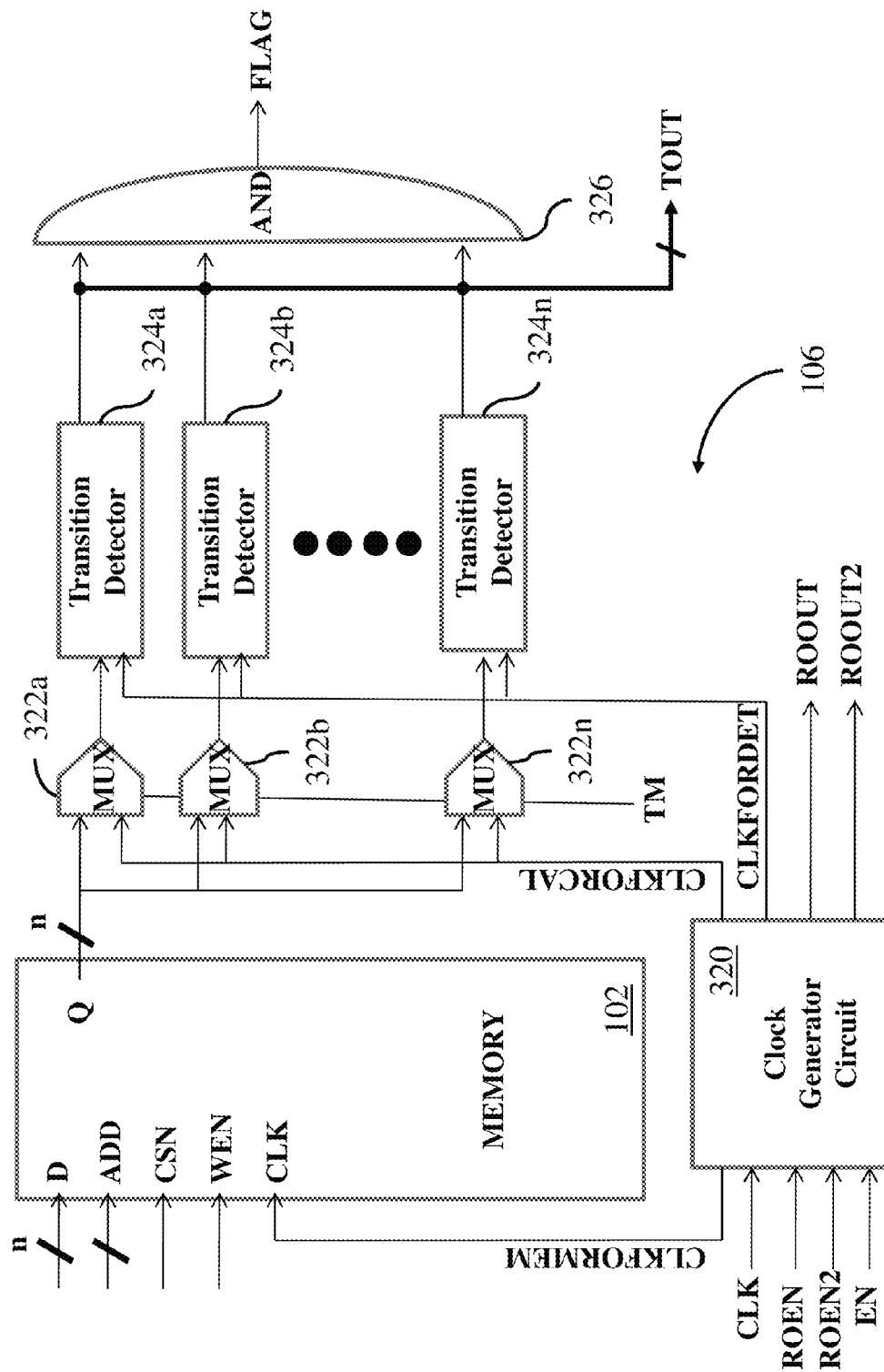
FIG. 3 illustrates a more detailed block diagram of an embodiment memory system.

FIG. 3 illustrates a more detailed block diagram of an embodiment memory system including test circuit 106 and memory 102. Test circuit 106 includes clock generator circuit 320, multiplexers 322*a-n*, transition detectors 324*a-n*, and FLAG control circuit 326. Memory 102 includes n-bit data input D and n-bit data output Q, where n may take any value for a memory system. FLAG control circuit 326 is depicted as an AND gate in FIG. 3, but may be implemented as any digital logic block.

According to various embodiments, clock generator circuit 320 generates pulses of different pulse widths for detection clock CLKFORDET. The pulse width duration is selected with select lines SEL1 and/or SEL2. Transition detectors 324*a-n* monitor outputs of multiplexers 322*a-n*, respectively, for data transitions. In some embodiments, if a data transition occurs during a pulse on detection clock CLKFORDET, the specific transition detector 324 for which the transition occurred outputs a logic high value to FLAG control circuit 326, indicating a correct transition. Logic high values and logic low values can easily be swapped as is known in the art. A bus line TOUT also may provide a signal for each data bit out of transition detectors 324*a*-324*n*. The specific bits may be used to identify specifically which bits are weak bits and not just addresses with weak bits.

According to some embodiments, during a read test multiplexers 322*a-n* are controlled by test mode select TM to select data outputs Q. Thus, transition detectors 322*a-n* monitor data outputs Q during a read test. Other control signals relevant to clock generator circuit 320 will be described with reference to FIG. 8. In the embodiment shown, output FLAG will take a logic high value if all transition detectors 324*a-n* output logic high values for correct data output transitions.

Figure 4:
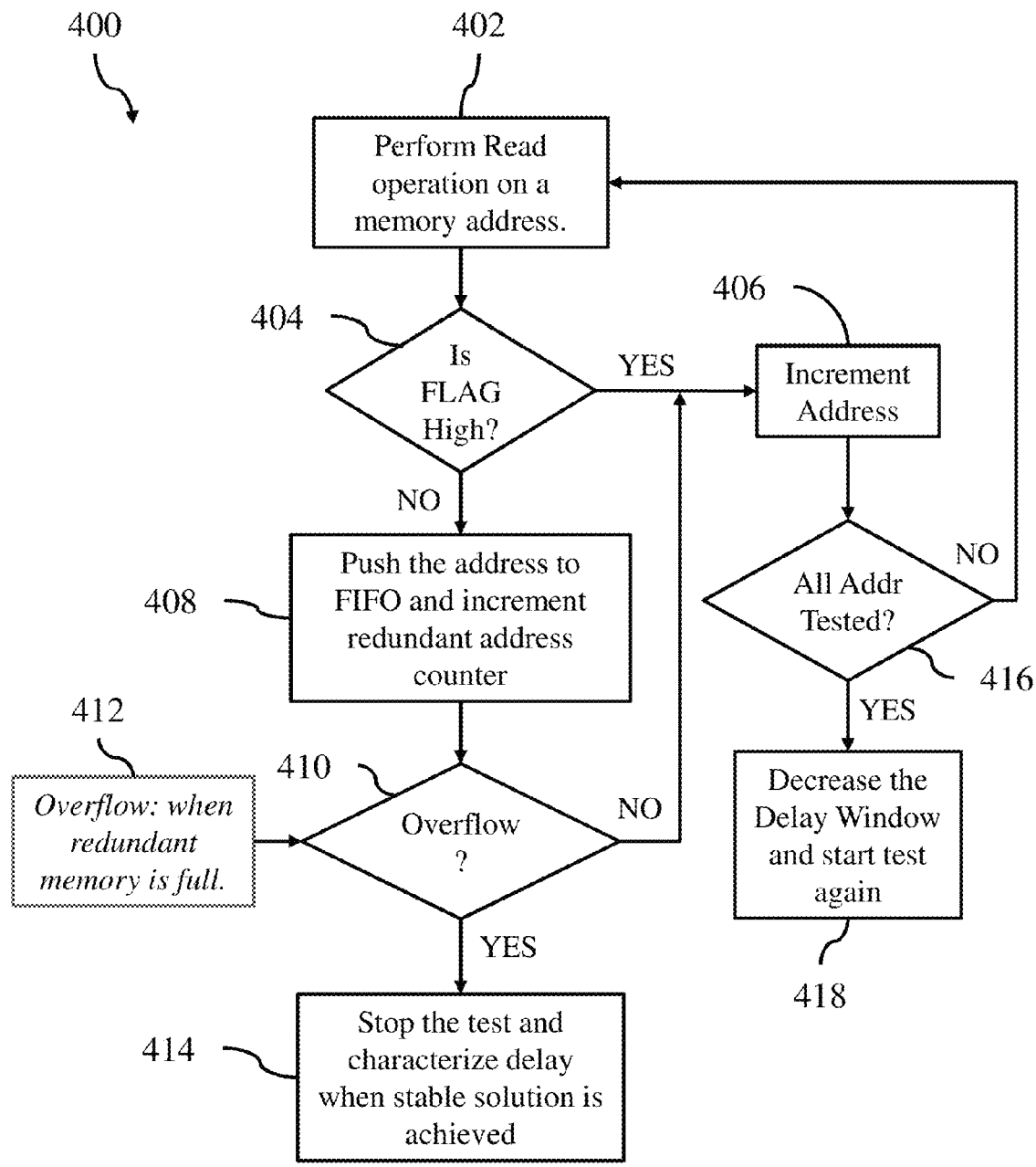
FIG. 4 illustrates a flowchart diagram of an embodiment method of characterizing a memory.

FIG. 4 illustrates a flowchart diagram of an embodiment method 400 of characterizing a memory by performing a read test characterization including steps 402-418. According to various embodiments, step 402 includes performing a read operation on a memory address. Step 402 may include supplying, to a memory, an address, a read command or enable, and a memory clock. During the read operation, a FLAG is monitored for a failed/passed read test. The FLAG may be produced from a circuit such as test circuit 106 as described previously. Step 404 includes checking if the FLAG is high and deciding which control flow to follow. As shown and described previously in reference to FIG. 3, a low FLAG indicates a failed read in a set time frame and a high FLAG indicates a successful read. In an alternative embodiment, the fail/pass indicated by FLAG polarity may be reversed.

If the FLAG is not high in step 404, step 408 follows step 404 and includes storing the address with the failed read, which may include a weak bit, in a memory by pushing the address onto a FIFO (a First In First Out memory block) and incrementing a redundant address counter. Following step 408, step 410 includes checking the redundant address counter against a redundant memory overflow value. The overflow value is obtained in step 412 and provided to a decision block in step 410 as shown. If overflow of the redundant memory is detected in step 410, step 414 follows step 410 and includes halting the read test characterization. Step 414 may also include characterizing the access time delays with distinct time ranges if a stable solution is achieved.

In an embodiment, a stable solution is achieved when large groups or the majority of bits fail the read test, i.e., when the delay window used by the transition detector corresponds to the actual limit of the read times of the normal memory bits and not the weak memory bits. In such embodiments, a read test is performed starting with a relaxed delay window. With a relaxed delay window, there are no read test failures and, thus, no information about the access time is known. Then, the delay window is reduced, but still no read test failures are identified. Then, the delay window is further reduced and a single read test failure may be identified. This may be a weak bit and this corresponding access time, i.e. the delay window time, is not the expected access time of the memory. Then, the delay window is further reduced again causing many bits to fail the read test. In such a case, a stable state has been identified because the delay window time is a good indication of the actual access time. Thus, the delay window can then be measured in order to identify the characterization time.

If the FLAG is high in step 404 or if overflow of the redundant memory is not detected in step 410, step 406 may follow and includes incrementing the memory address under test. Step 416 follows step 406 and includes checking if all addresses in the memory have been tested. If all the addresses have been tested, step 418 follows step 416 and includes decreasing the delay window used by the test circuit 106, for example, during the read test and repeating the steps of method 400 for all address with the new delay window. The delay window is referred to as the pulse width in FIG. 2. If all the addresses have not been tested, the control flow moves back to step 402 with the incremented memory address under test to repeat the read test thereon.

In an alternative embodiment, the delay window may be decreased between read tests performed on a same address. In such an embodiment, a read test is performed on an address, then the delay window is decreased, and the read test is performed again. In various embodiments, the delay window may be decreased numerous times and read tests may be performed on any number of addresses in the memory in between decreasing the delay window.

Figure 5:
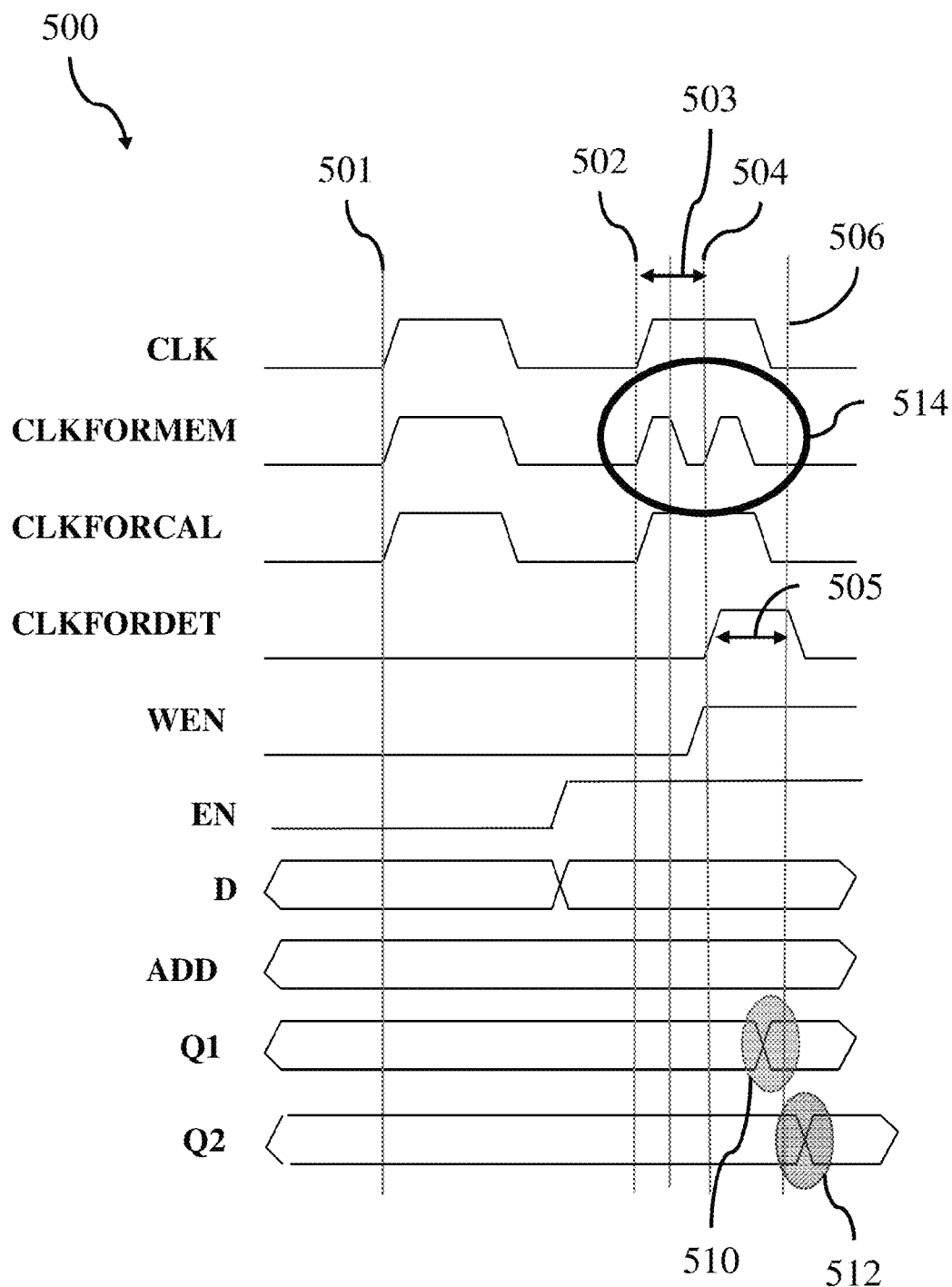
FIG. 5 illustrates a timing diagram of another embodiment method of characterizing a memory.

FIG. 5 illustrates a timing diagram 500 of another embodiment method of characterizing a memory according to a read-after-write test that includes performing a read operation on a same memory address immediately after performing a write operation to the memory address. As shown, memory address ADD does not change during timing diagram 500. A first start signal 501 includes a common clock edge for system clock CLK, memory clock CLKFORMEM, and calibration clock CLKFORCAL. After the first start signal 501 and before the second start signal 502, enable EN is activated.

According to various embodiments, second start signal 502 begins a write operation of data value D to memory address ADD. Simultaneously, a first delay pulse with pulse width 503 is activated in a circuit, such as test circuit 106. During the first delay pulse, write enable WEN, depicted as an active low signal, is disabled (by setting the value high). Immediately after finishing the first delay pulse, a read operation is initiated at read start 504 as indicated by a second clock on memory clock CLKFORMEM. Also at read start 504, a second delay pulse with pulse width 505 is activated in a circuit, such as test circuit 106, as shown on detection clock CLKFORDET.

In the embodiments shown, two output data Q1 and Q2 are depicted to change value during the read test. Q1 includes transition 510 before the second delay pulse is finished at falling edge 506 and indicates a successful read operation. Q2 includes transition 512 after the second delay pulse is finished at falling edge 506 and indicates a failed read operation. Bubble 514 encircles a double pulse on memory clock CLKFORMEM that causes a write operation followed by a read operation. In various embodiments, the first delay pulse determines when to trigger the read operation following the write operation. The first delay pulse may be generated by a generation circuit such as clock generation circuit 320. The generation circuit may be controlled to select the first pulse delay pulse width 503 based on a minimum required write time.

As described in reference to FIG. 2, in some embodiments the first and second delay pulses with pulse widths 503 and 505 may only indicate first and second time periods or durations between start signals, such as start signal 502 for example, and falling edges, such as falling edge 506 for example. The first and second time periods may or may not include actual signal pulses and, if included, the pulses may start before, at, or after the respective start signal. Data transitions occurring after the second time period may indicate a failed data transition and/or a weak bit.

According to various embodiments, the read-after-write test depicted in FIG. 5 is performed as a more sensitive test for detecting weak bits. There may be weak bits that pass the basic read test, but performing a read test immediately after a write operation may expose underperforming bits. Mechanisms of delayed read operations after write operations depend on the type of memory used. In various specific embodiments, a weak bit may exhibit delayed charging of the internal node of a memory cell. In most memory bitcell configurations, the write operation on the bitcell is performed by pulling down the bitlines. Consequently, the internal node of the bitcell is discharged through the bitline. The other internal node, however, may be charged to the supply through the internal pull-up device of the bitcell. This pull-up device is the smallest device of the bitcell since it does not impact the $I_{cell}$. Moreover, in some embodiments, the pull-up device is a PMOS device which is inherently slower than an NMOS device. A weak bit may exhibit delayed charging of this node, and hence delayed write time. If the write time provided for the bitcell is less than the required write time for the given weak bit, it can lead to insufficient drive current ($I_{cell}$) due to an under-driven gate of the pull down device during a read operation immediately following the write operation. In another specific case, the read operation following the write operation may be destructive, causing the bitcell state to flip during the read operation.

Figure 6A:
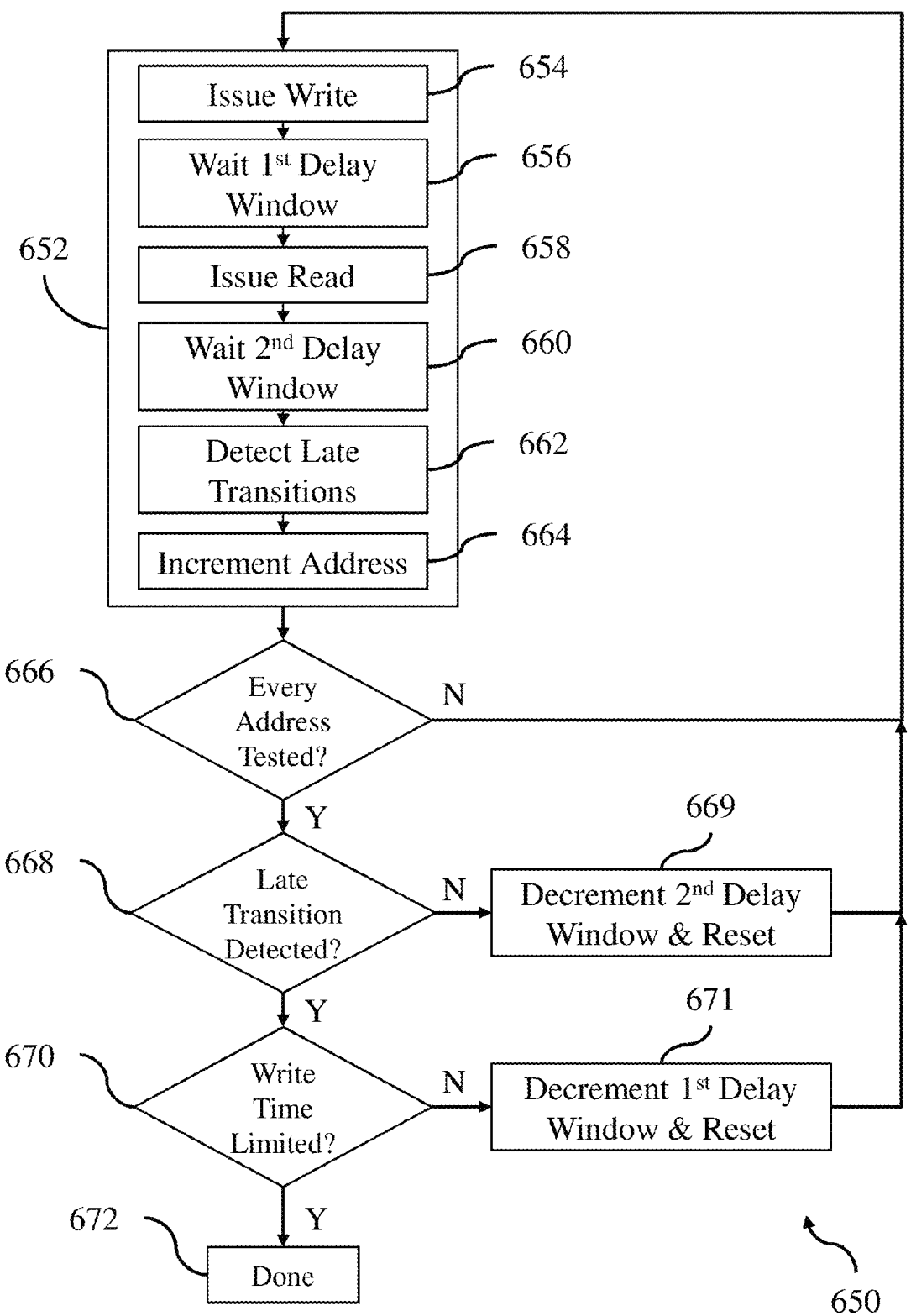
FIGS. 6a-6b illustrate flowchart diagrams of further embodiment methods of test operations for a memory.
Figure 6B:
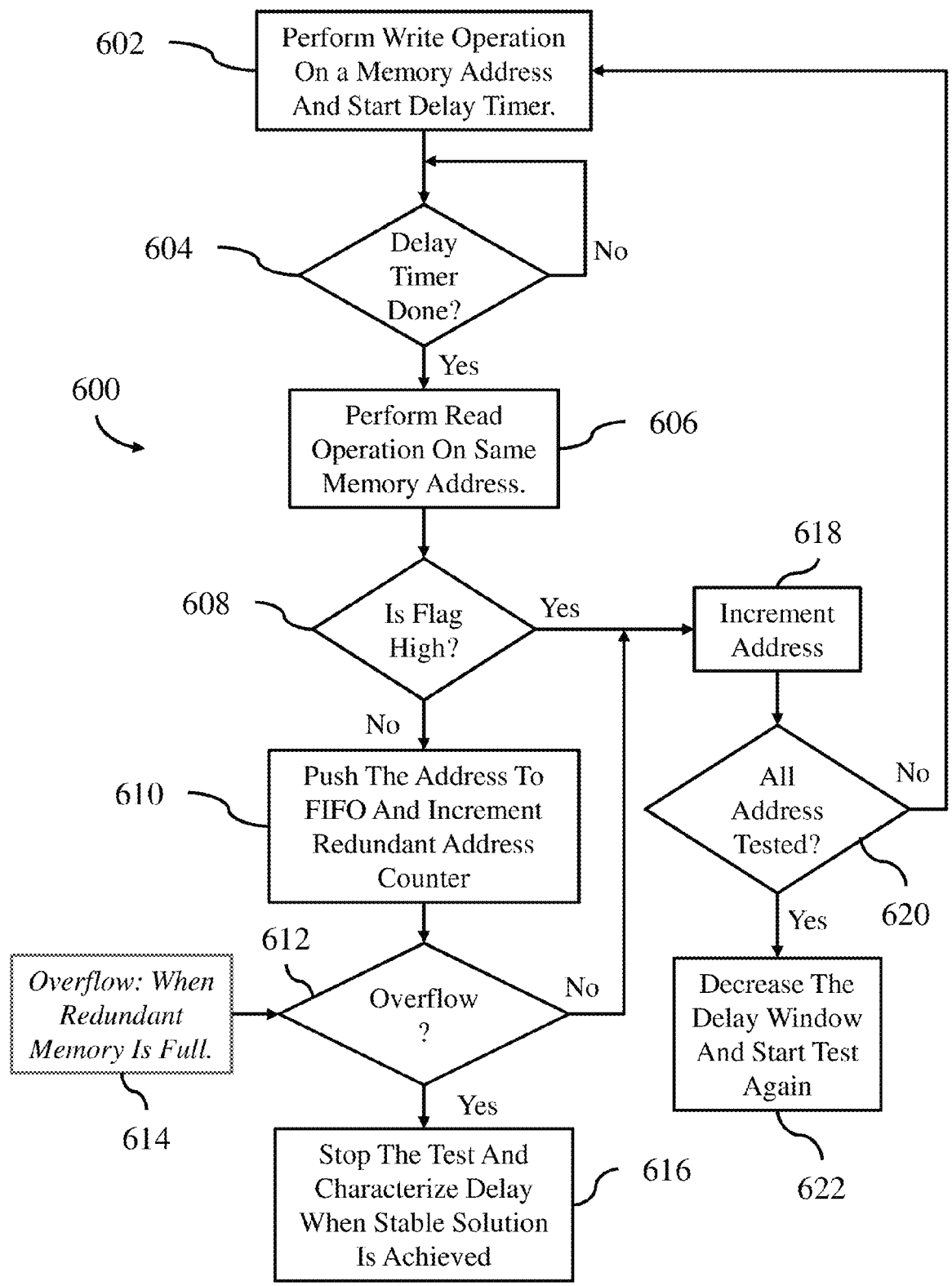

FIGS. 6a-6b illustrate flowchart diagrams of further embodiment methods of test operations 600 and 650 for a memory. According to various embodiments, testing operations 600 and 650 illustrate a read-after-write test characterization or test operation. Testing operation 600 in FIG. 6b includes steps 602-622 and testing operation 650 in FIG. 6a includes steps 652-672. Test operation 650 depicts a more general read-after-write test that includes implementing a triple nested for loop. Read-after-write test 652 may include issuing a write command in step 654, waiting a first time period equal to a first delay window in step 656, issuing a read command on the same address as the write operation in step 658, waiting a second delay window in step 660, using the transition detector to identify weak bits by detecting transitions after the second delay window in step 662, and incrementing the test address in step 664.

In various embodiments, the read-after-write test 652 is performed with a triple nested for loop that loops through the first delay time, second delay time, and each address by the conditional blocks 666, 668, and 670. If conditional block 666 is false, every address has not been tested and read-after-write test 652 is performed again at the next address. Once every address has been tested, conditional block 668 checks if a late transition is detected. In some embodiments, the second delay window may be decremented and the test address reset in step 669 until a late transition is detected. In various embodiments, if a late transition is detected, the address may be stored and characterized as containing a weak bit. Further, the address may be compared against addresses identified from a read test according to method 400 in FIG. 4. If the addresses do not match, the identified weak bit may be further characterized as a write time limited weak bit. Conditional block 670 checks if the identified weak bit is a write time limited weak bit. If so, the test operation 650 identified a write time limited weak bit and the test is finished in step 672. In some embodiments, the identified write time limited weak bit is the weakest bit in the memory. If the identified weak bit is not write time limited, the first delay window may be decremented, the second delay window reset, and the test address reset in step 671. Following step 671, the read-after-write test 652 is performed again for every address and second delay window until a late transition is detected.

According to the specific steps illustrated in the embodiment shown in FIG. 6b, step 602 includes performing a write operation on a memory address and starting a delay timer. The delay timer is configured to generate a delay time between the beginning of the write operation and the beginning of the read operation. Step 604, following step 602, includes waiting for the delay timer to finish and looping repeatedly. After the delay timer finishes, step 606 includes performing a read operation on the same memory address. The read operation begins the read test described in reference to FIG. 4 and the remaining steps in method 600 are very similar to method 400.

In various embodiments, step 608, following step 606, includes checking if FLAG is high, indicating a passed read-after-write test. If FLAG is low, step 610 follows step 608 and includes pushing the memory address with a potentially weak bit onto a FIFO and incrementing the redundant address counter. Step 612 follows step 610 and includes checking the redundant memory for overflow of addresses indicated in step 614. If overflow is detected, step 616 follows step 612 and includes halting the read-after-write test in order to characterize the access time delays with distinct time ranges as in step 414 in FIG. 4.

If FLAG is high in step 608 or if overflow is not detected in step 612, step 618 follows and includes incrementing the memory address under test. Step 620 follows step 618 and includes checking if all memory addresses have been tested. If all memory addresses have been tested, the delay window is decreased in step 622 and the entire test series may be repeated with the decreased delay window. If all memory addresses have not been tested, step 602 follows step 620 and repeats the read-after-write test at the incremented memory address. As with reference to FIG. 4, the order of incrementing memory addresses and decreasing delay windows may be rearranged in various embodiments.

According to various operations, once a weak bit or a plurality of weak bits has or have been identified and remapped to a redundant memory, various test operations or characterization tests may be performed again on a primary memory according to methods described herein. In such embodiments, a further weak bit or plurality of weak bits may also be identified and remapped to a redundant memory. Such a process may be repeated a set number of iterations, until the redundant memory is full or until a specific performance such as minimum read time is achieved.

Figure 7:
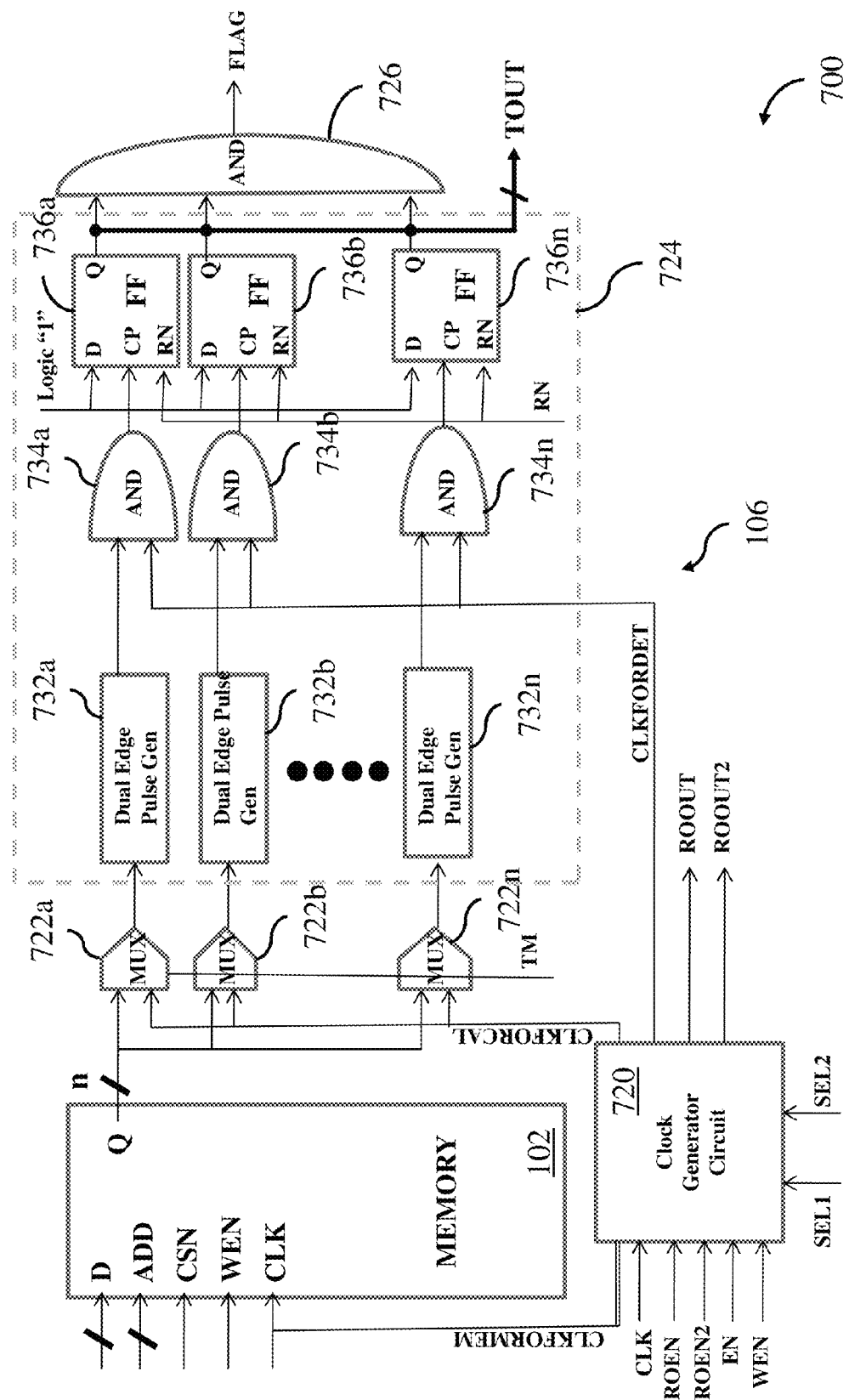
FIG. 7 illustrates a block diagram of a further embodiment memory system.
Figure 8:
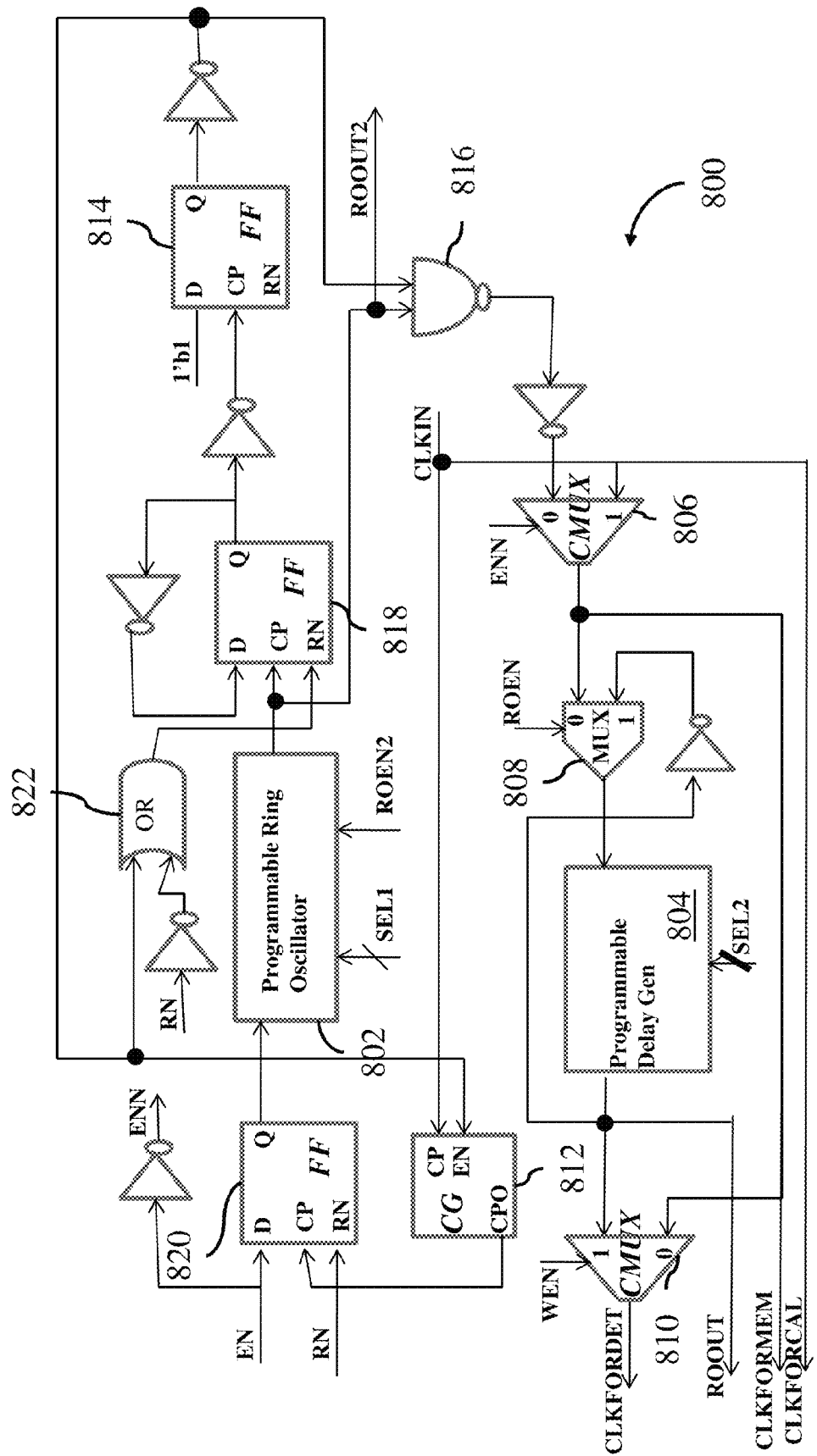
FIG. 8 illustrates a block diagram of an embodiment clock generation circuit.

FIG. 7 illustrates a block diagram of a further embodiment memory system 700 including memory 102 and test circuit 106. According to the embodiment shown, test circuit 106 may be implemented to include clock generator circuit 720, multiplexers 722a-n, transition detector 724, and AND gate 726 for generating the output FLAG. Operation of clock generator circuit 720 may function as described above in reference to FIG. 3 and will be further described in reference to FIG. 8. Multiplexers 722a-n select between n-bit memory data output Q and calibration clock CLKFORCAL based on test mode select TM. In reference to all figures described herein, various blocks with similar reference numbers may be implemented as different blocks with different characteristics or as same blocks with identical characteristics. For example, clock generator circuits 320 and 720 may be different, similar, or identical blocks in various embodiments.

According to various embodiments, transition detector 724 depicts an implementation of transition detectors 324a-n in FIG. 3. Transition detector 724 includes dual edge pulse generators 732a-n that generate pulses of a specific pulse width when a transition is detected on outputs of multiplexers 722a-n. As shown, outputs of dual edge pulse generators 732a-n are coupled to inputs of AND gates 734a-n, respectively. Coupled to another input of each AND gate is detection clock CLKFORDET from clock generator circuit 720. In various embodiments, detection clock CLKFORDET will include pulses of specific pulse widths selected by select lines SEL1 and/or SEL2.

According to various embodiments, AND gates 734a-n are coupled to clock inputs CP of D-type flip-flops 736a-n, respectively. Flip-flops 736a-n have inputs D coupled to a high logic value, as shown and reset signals coupled to a main reset signal RN. Thus, if detection clock CLKFORDET is high (i.e. a duration of a pulse has not passed) and a transition is detected by a dual edge pulse generator 732a-n, the respective AND gate 734a-n will clock the respective flip-flop 736a-n and cause a logic high value to be output on flip-flop output Q, which is coupled to AND gate 726. If all flip-flop outputs have logic high values, output FLAG will also go high, indicating a successful read operation. A successful read operation may indicate the absence of weak bits at a memory address under test. If not all the flip-flop outputs have logic high values, output FLAG will stay low, indicating a failed read operation and the potential of a weak bit at the memory address under test. Data bus TOUT may identify which flip-flop outputs have logic low values, indicating which bits at the address may be weak.

In various embodiments, the digital logic associated with detecting weak bits, for example, transition detector 724, may introduce some timing offset or delay. In order to characterize the timing offset, test mode select TM for multiplexers 722a-n and calibration clock CLKFORCAL may be used. Test mode select TM may be set to select the signal on calibration clock CLKFORCAL instead of the data output Q for multiplexers 722a-n. Then, both calibration clock CLKFORCAL and detection clock CLKFORDET may have a test pulse applied. The pulse width of the test pulse may be successively decreased. At a certain pulse width, the output FLAG may change from 1 to 0. This pulse width may correspond to the timing offset introduced by transition detector 724, for example.

FIG. 8 illustrates a block diagram of an embodiment clock generation circuit 800 including a programmable ring oscillator 802 and a programmable delay generator 804. According to various embodiments, a delay or oscillation frequency is selected for programmable ring oscillator 802 via select line SEL1. When programmable ring oscillator 802 is enabled, an oscillating output is supplied to multiplexer 806 via digital logic gates and D-type flip-flops as shown. The logic gates and D flip-flops shown generate two pulses with a delay between the two active edges of these pulses selected or programmed by SEL1. For example, in one embodiment, the logic gates and D flip-flops shown generate exactly two pulses with a delay between the two active edges of these pulses selected or programmed by SEL1. The oscillating output is used during the read-after-write test in order to control the oscillating signal on memory clock CLKFORMEM. Thus, select line SEL1 controls the delay between beginning a write operation and beginning a read operation, as described with reference to FIG. 5.

In the embodiment shown, programmable delay generator 804 is used to generate the pulse used for detection clock CLKFORDET. Select line SEL2 controls which pulse width is selected for detection clock CLKFORDET. The multiplexer 808 selects between an oscillation mode used during characterization of a memory system and a delay mode used in generating pulses for week bit identification during read tests and read-after-write tests. In various embodiments, monitor outputs ROOUT and ROOUT2 may be coupled to a digital controller for monitoring test pulses during characterization of a memory system. According to various embodiments, both programmable ring oscillator 802 and programmable delay generator 804 may be implemented with standard delay logic and/or ring oscillators, as is known in the art.

According to various embodiments, read enable is an active low signal that enables read mode, write enable WEN is an active low signal that enables write mode, delay enable ROEN enables programmable delay generator 804, and ring enable ROEN2 enables programmable ring oscillator 802. In various embodiments, these enable signals may be arranged to control the operation of clock generation circuit 800. Further, reset RN may reset clock generation circuit 800 and delay outputs ROOUT and ROOUT2 may be used to monitor delay pulses from programmable delay generator 804 and programmable ring oscillator 802, respectively.

Figure 9:
FIG. 9 illustrates a table of test values for an embodiment method of characterizing a memory.

FIG. 9 illustrates a table 900 of test values for an embodiment method of characterizing a memory. Table 900 is filled with alternating binary values of 0 and 1. According to various embodiments, it may be useful to store inverse and alternating bits in a checkerboard pattern as shown such that every read operation at an adjacent address will produce a data transition on every bit of a memory data output line. In such an embodiment, a read test could be performed on a memory system by sequentially stepping through each address. As shown, each memory address is indicated by A0-An and each data bit is indicated by Dx-D0, where n+1 is the number of addresses in the memory and x+1 is the number of bits at each address. For example, if a read operation is performed at A3 following a read operation at A2, every output bit will toggle because the data value stored at A3 is the bitwise inverse of the data value stored at A2.

Figure 10:
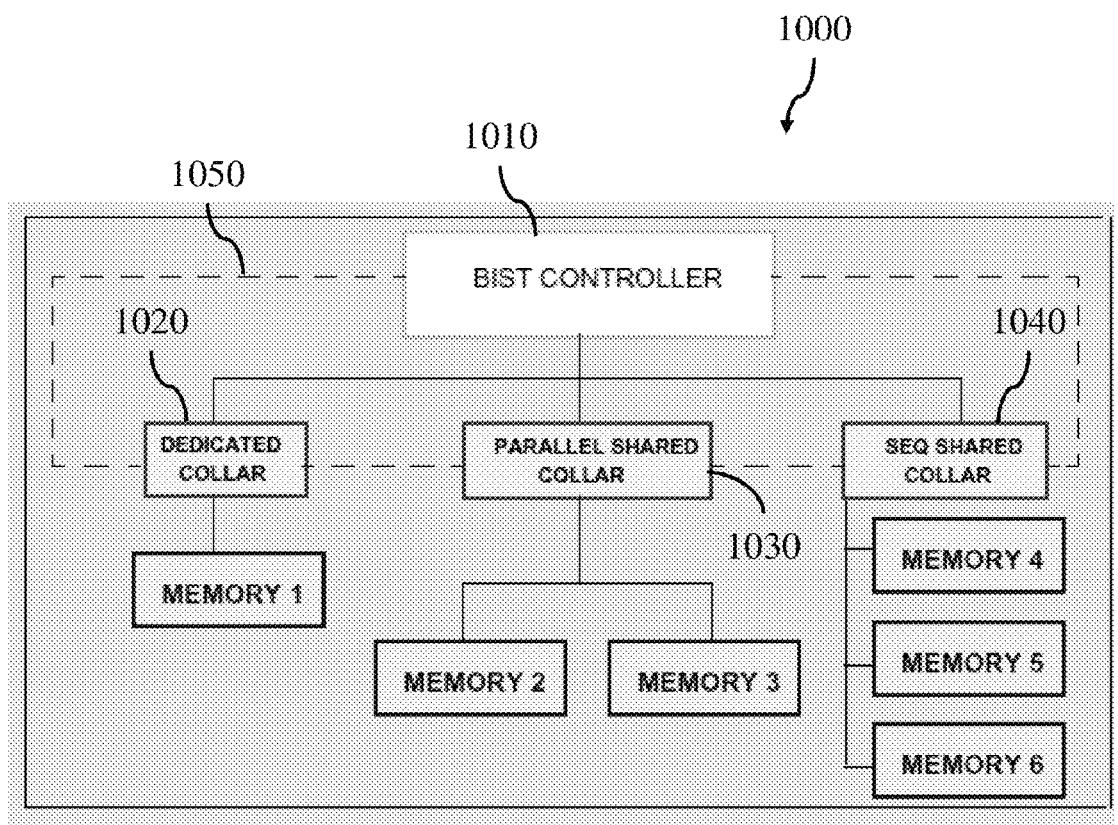
FIG. 10 illustrates a block diagram of an embodiment control circuit and memory system.
Figure 11:
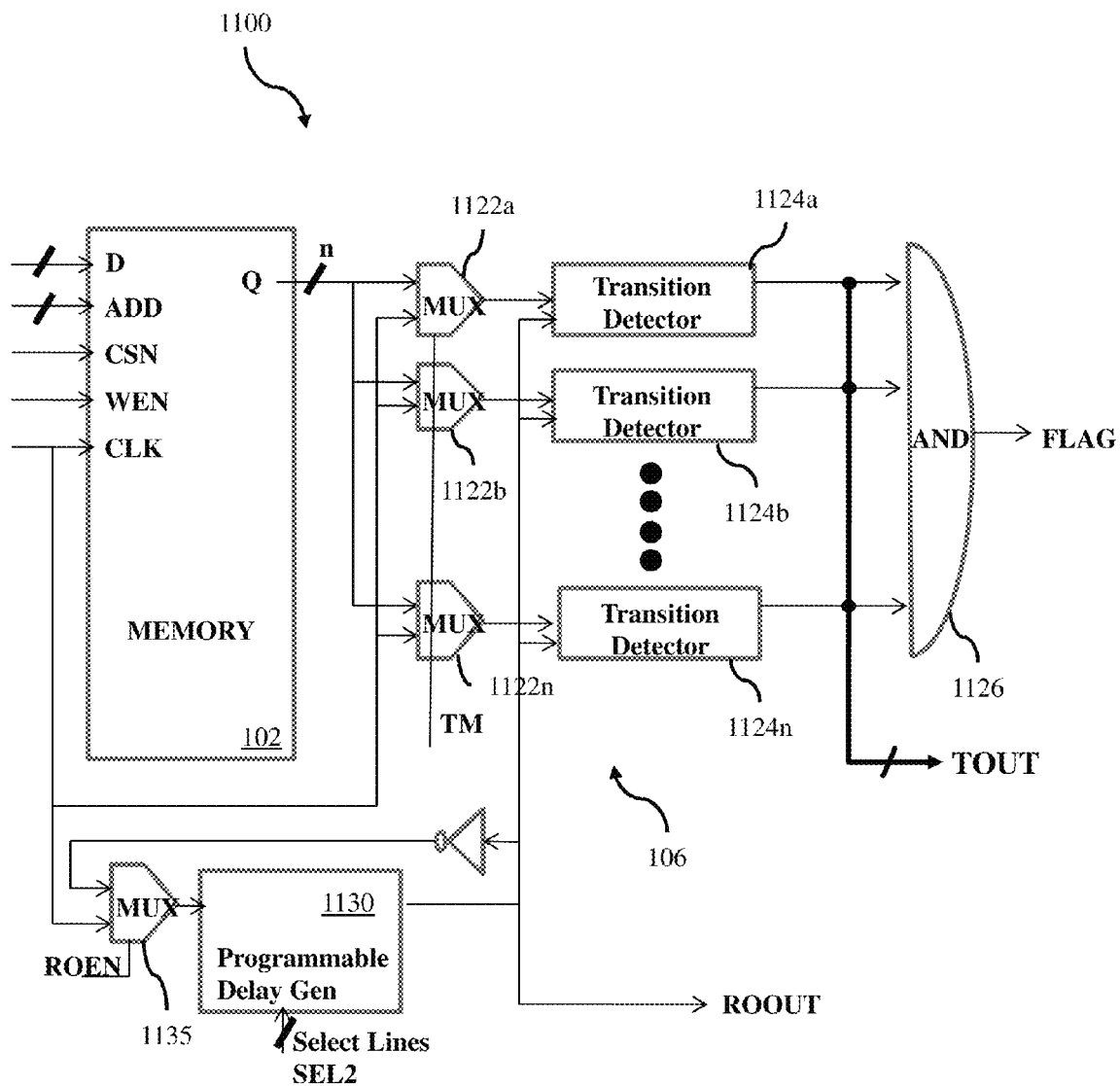
FIG. 11 illustrates a block diagram of an alternative embodiment memory system.

FIG. 10 illustrates a block diagram of an embodiment memory system 1000 including a BIST controller 1010, memory collars 1020-1030, and memory blocks 1-6. According to various embodiments, control circuit 1050 may correspond to an implementation of digital control circuit 108, for example, as described in reference to FIG. 1. BIST controller 1010 may include various implementations of a standard BIST unit and additional digital logic in order to incorporate a read test and read-after-write test as described herein. In some embodiments, BIST controller 1010 is implemented as a ROM based BIST. In other embodiments, BIST controller 1010 is implemented as a finite state machine based BIST.

As shown, BIST controller 1010 is coupled to memory collars 1020-1040. According to various embodiments, BIST controller 1010 may be interfaced to multiple memory units via memory collars 1020-1040, as shown. Dedicated memory collar 1020 is a dedicated collar and is coupled to a single block memory 1. Parallel shared memory collar 1030 is a parallel collar and is coupled to parallel blocks memory 2 and memory 3. Sequential shared memory collar 1040 is a sequential collar and is coupled to blocks memory 4, memory 5, and memory 6. Various combinations of BIST to memory interfaces may be used depending on system design requirements.

FIG. 11 illustrates a block diagram of an alternative embodiment memory system 1100 including memory 102, transition detectors 1124a-n, and programmable delay generator 1130. Memory system 1100 is operated and characterized as described before with reference to the other figures with the exception of programmable delay generator 1130. In place of clock generator circuits as described previously, programmable delay generator 1130 may be a simpler implementation that is coupled to transition detectors 1124a-n. In various embodiments, programmable delay generator 1130 generates pulses of different pulse widths as controlled by select line SEL2. Multiplexer 1135 is used to enable and disable programmable delay generator 1130 via enable ROEN.

Figure 12:
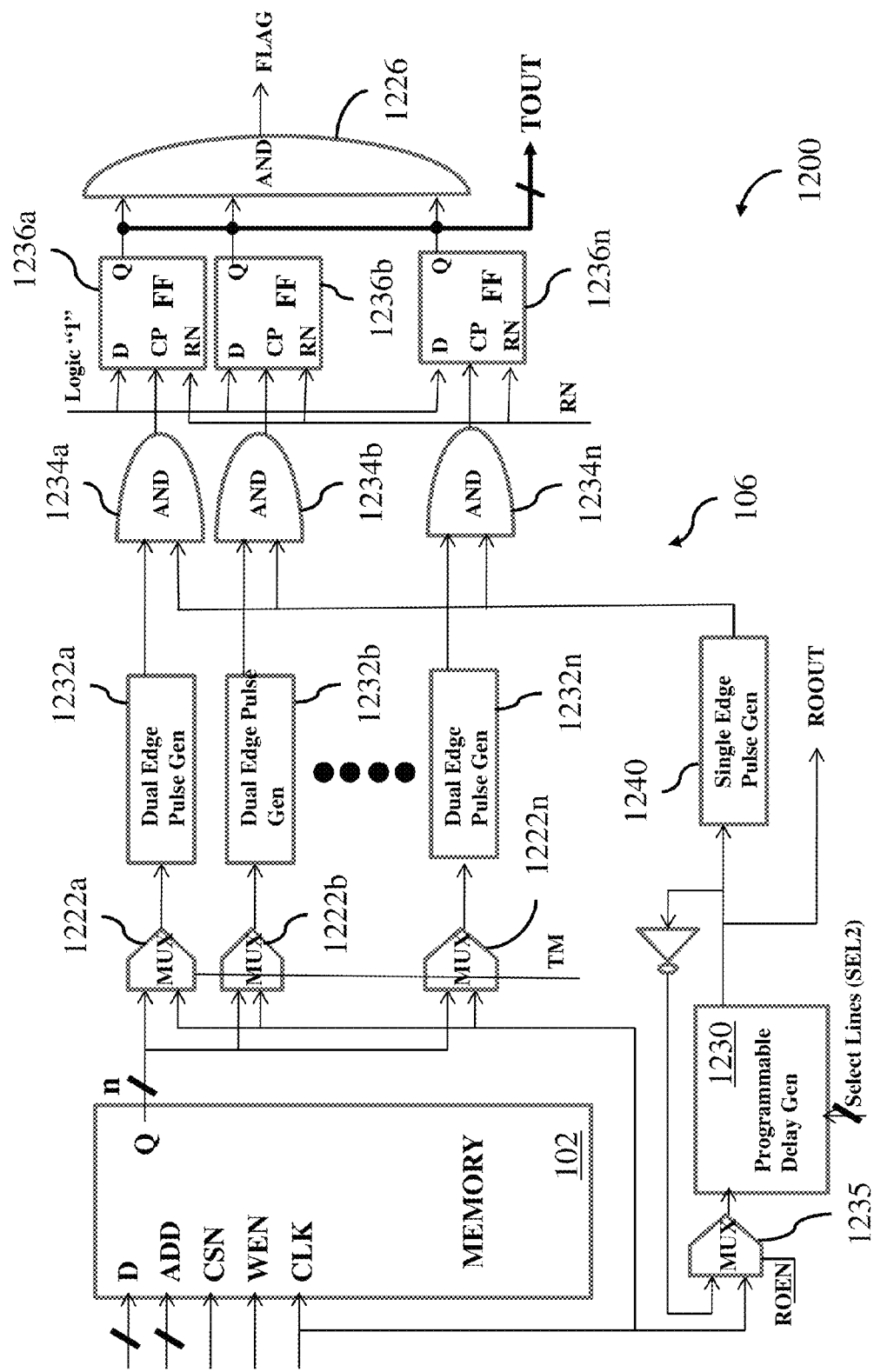
FIG. 12 illustrates a block diagram of a second alternative embodiment memory system.

FIG. 12 illustrates a block diagram of a second alternative embodiment memory system 1200 including a specific implementation of transition detector 1124. The various components included in memory system 1200 function as described with reference to similar components in the other figures. An exception is single edge pulse generator 1240, which generates a single edged pulse after a delay time corresponding to the delay pulse width used to compare against transitions and detect slow transitions and/or weak bits.

Figure 13:
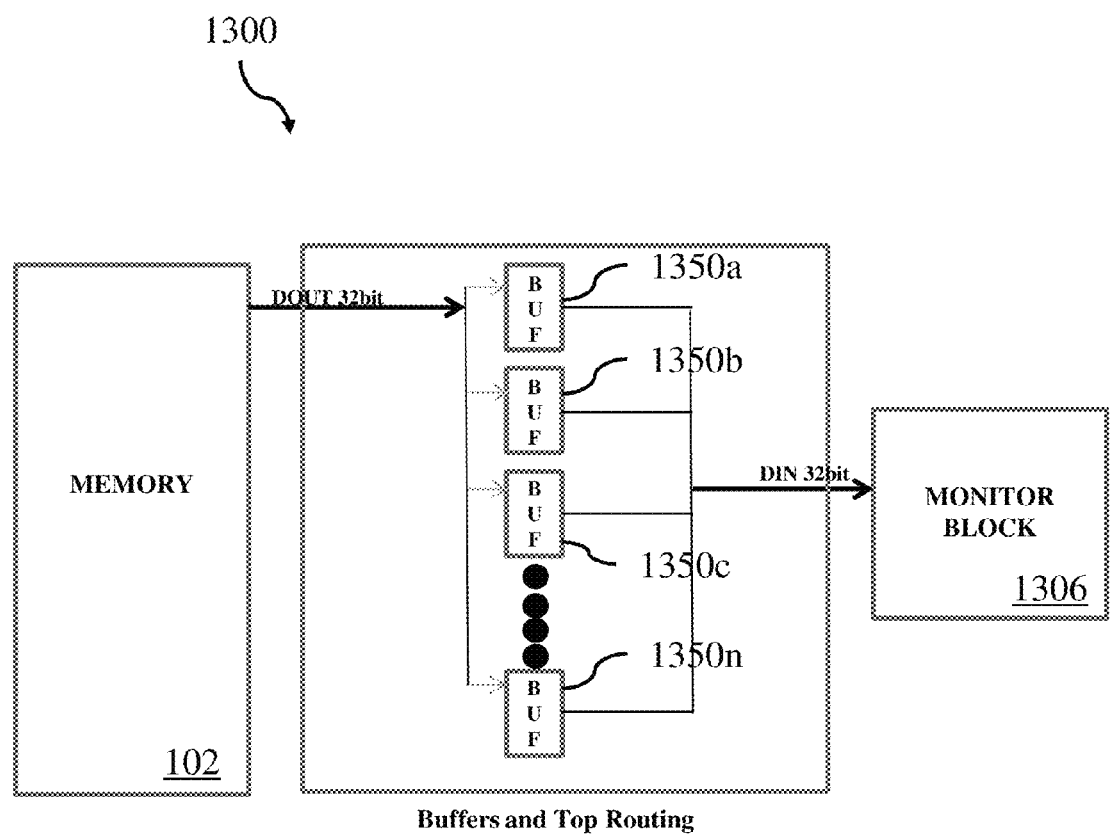
FIG. 13 illustrates a block diagram of an additional embodiment memory system.
Figure 14A:
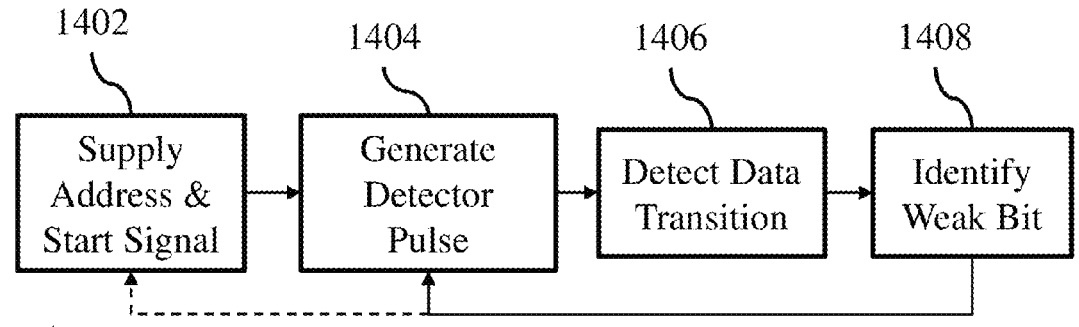
FIGS. 14a-14c illustrate methods of operation of memory systems in accordance with various embodiments.
Figure 14B:
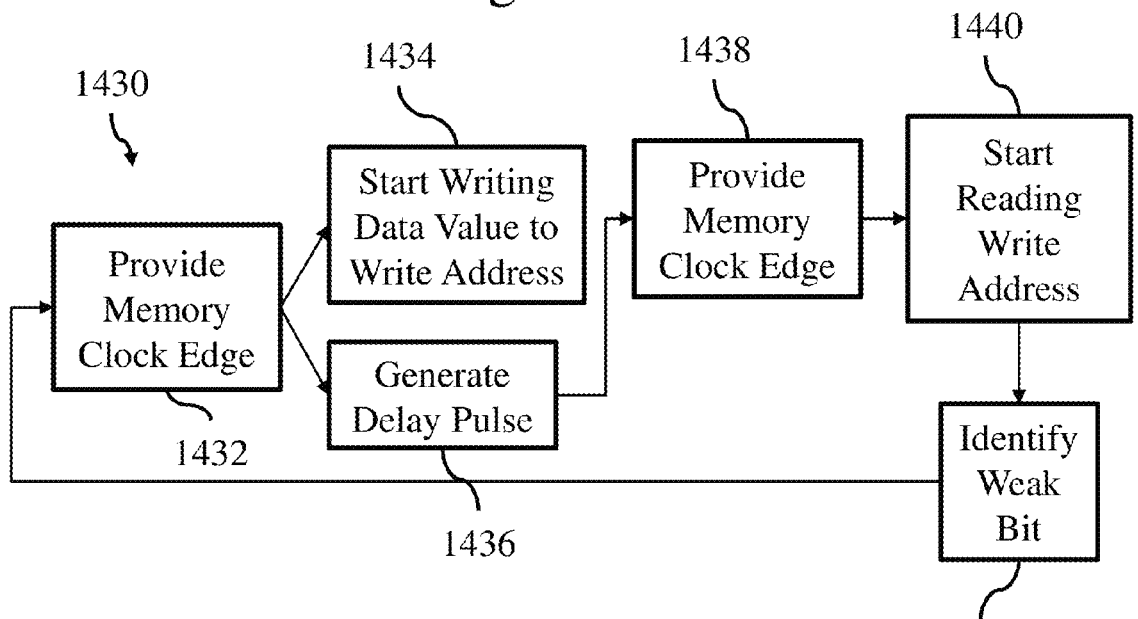
Figure 14C:
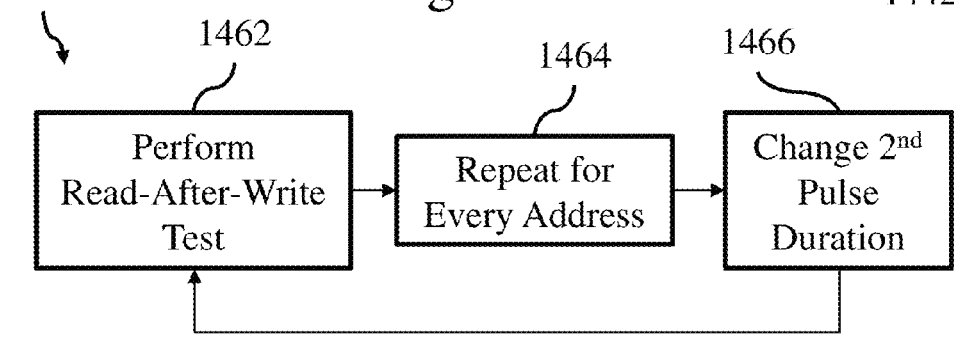

FIG. 13 illustrates a block diagram of an additional embodiment memory system 1300 including memory 102, monitor block 1306, and buffers 1350a-n. According to various embodiments, buffers 1350a-n are coupled between memory 102 and monitor block 1306. In such embodiments, buffers 1350a-n are configured to equalize delays on data line DOUT coupled between memory 102 and monitor block 1306. In various embodiments, monitor block 1306 may include test circuit 106. In the embodiment shown, a buffer is included for every bit on 32-bit data line DOUT.

FIGS. 14a-14c illustrate methods of operation of memory systems in accordance with embodiments of the present invention. FIG. 14a illustrates a method of operation 1400 including steps 1402, 1404, 1406, and 1408. According to various embodiments, step 1402 includes supplying an address to a memory system and generating a start signal. In various embodiments, the start signal may include a clock edge. Following step 1402, step 1404 includes generating a detector pulse when the start signal is received. The detector pulse may be a pulse for a transition detector and may have a first pulse width.

According to the embodiment shown, step 1406 includes detecting a data transition. The address and start signal supplied to the memory in step 1402 may initiate a read operation that produces data transitions on data output lines of the memory. Any such data transitions are detected in step 1406. In step 1408 the detector pulse and the detected data transitions are compared in order to identify a weak bit. In some embodiments, if the data transitions occur during the detector pulse, a weak bit is not identified, but if a data transition occurs after the detector pulse, a weak bit may be identified. Following step 1408, a detector pulse with a second pulse width may be generated by returning to step 1404. Alternatively, a new address may also be supplied by returning to step 1402 as shown by the dotted connection.

FIG. 14b illustrates method of operation 1430 including steps 1432-1442 for performing a read-after-write test. Step 1432 includes providing a first memory clock edge to a memory system. The memory clock edge may function as a start signal. Following step 1432, steps 1434 and 1436 begin simultaneously. Step 1434 includes beginning a write operation by starting to write a data value to a write address and step 1436 includes generating a delay pulse. In various embodiments, the delay pulse is used to control a delay time between beginning a write operation and beginning a read operation. After the delay pulse is past, step 1438 includes generating a second memory clock edge. The second memory clock edge causes step 1440 to begin, which includes starting a read operation at the write address. Following step 1440, step 1442 includes identifying a weak bit during the read operation that was started. In various embodiments, step 1442 may include steps as described with reference to method of operation 1400 in FIG. 14*a*. Following step 1442, method of operation 1430 may be repeated at a different address or with pulses of different pulse widths by returning to step 1432. In some embodiments, weak bits identified in step 1442 at different addresses may be compared based on the delay pulse used and the weakest bit or bits may be identified.

FIG. 14*c* illustrates method of operation 1460 including steps 1462, 1464, and 1466. According to various embodiments, step 1462 includes performing a read-after-write test at a first address as described with reference to method of operation 1430 in FIG. 14*b*. After performing a first read-after-write test, step 1464 includes repeating the read-after-write test for every address. As described previously, the read-after-write test has a first delay pulse between the write operation and the read operation as well as a second detection pulse during the read operation. Once the read-after-write test has been performed on every address in step 1464, the process may be repeated again with a new second pulse duration for the detection pulse. Step 1466 includes changing the second pulse duration before repeating method of operation 1460 by returning to step 1462.

Figure 15:
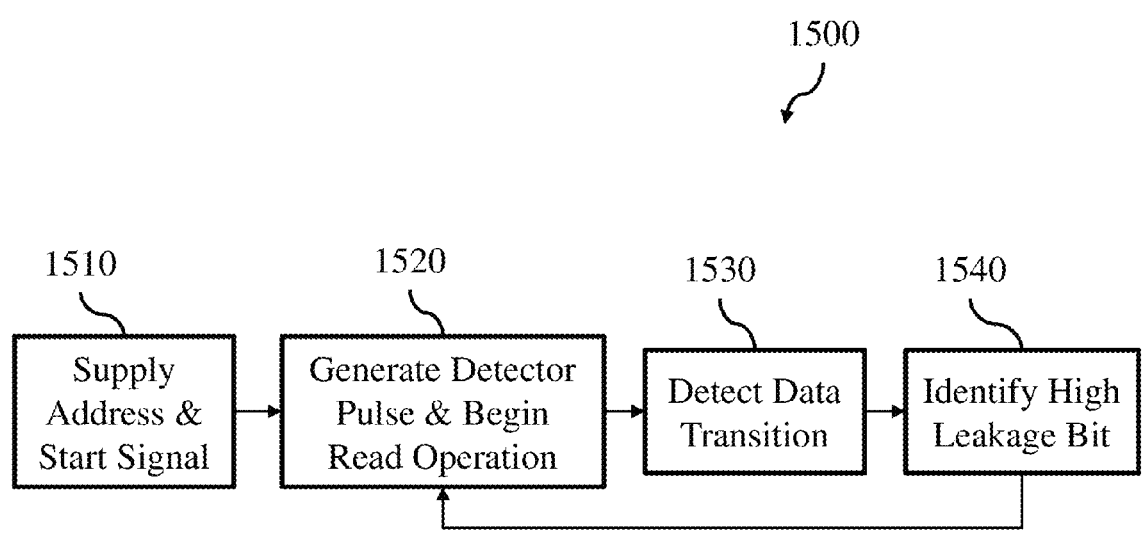
FIG. 15 illustrates a method of operation of a memory system according to an alternative embodiment.

FIG. 15 illustrates a method of operation 1500 of a memory system according to an alternative embodiment that includes steps 1510-1540. Method of operation 1500 depicts an alternative characterization test in which fast transitions are detected. According to various embodiments described so far, weak bits may be identified based on slow transitions after a read command. In the alternative embodiment shown in FIG. 15, a weak bit may be a high leakage bit. Such a high leakage bit may be identified with a fast read test rather than a slow read test. A high leakage bit is a bit that transitions too quickly and therefore may be liable to other disadvantages, such as a high leakage current, for example. In various alternative embodiments, it may be beneficial to remove high leakage bits by remapping high leakage bit addresses to the redundant memory as described previously.

In order to identify high leakage bits, method of operation 1500 performs a read test as described previously with some modifications. According to various embodiments, step 1510 includes supplying an address to a memory system and generating a start signal. In various embodiments, the start signal may include a clock edge. Following step 1510, step 1520 includes generating a high leakage detector pulse and beginning a read operation at the address when the start signal is received. The high leakage detector pulse may be a pulse for a transition detector and may have a first high leakage pulse width. In general, compared to pulse widths in the read tests described previously, the first high leakage pulse width has a shorter duration.

Following step 1520, step 1530 includes monitoring and detecting a transition on an output data line of the memory. In the high leakage read test, if a transition is detected during the time high leakage detector pulse is active, i.e. within the first high leakage pulse width, a high leakage bit may be identified in step 1540, which follows step 1530. In some embodiments, after step 1540, steps 1520-1540 may be repeated with a second high leakage pulse width that is shorter in duration than the first high leakage pulse width. The pulse widths may be successively shortened until a single or a small number of high leakage bits are identified. Similar to other tests described herein, the high leakage test may be repeated for every address in a memory.

In various embodiments, characterization tests may be performed at various points in a memory system life cycle. For example, a memory system may be characterized according to embodiments described herein during fabrication and packaging, before delivery to a customer, or by the customer once the customer has received the memory system. In further embodiments, the characterization tests may also be performed during the memory systems life cycle. In some specific embodiments, characterization tests may be performed at specific times in the memory system lifetime, such as after a given number of months or years or after a specific number of read or write commands. In another embodiment, the characterization tests may be performed after specific usage scenarios, such as usage with abnormal operating temperature ranges or supply voltages.

According to various features of embodiments as described herein, advantages may include identification of bits that do not fail hard tests, but are likely to fail in the future. As a result, embodiments of memory systems described herein may exhibit increased reliability and longevity, improved performance, greater yield, more precisely defined performance characteristics, and other features. More specifically, replacing weaker bits with bits from a redundant memory may enable higher speed and lower power operation. The number of test escapes may be reduced during initial characterization and wafer selection resulting in improved memory quality with decreased variation. Identifying and replacing failed or failing bits during a memory system life cycle may also increase the effective lifetime of the memory system.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method for testing a memory, the method comprising:
receiving an address and a start signal at the memory;
generating a first detector pulse at a test circuit in response to the start signal, the first detector pulse having a leading edge and a trailing edge;
detecting a data transition of a bit associated with the address, wherein the bit is a functional bit; and
determining whether the bit is a weak bit by determining whether the data transition occurred after the trailing edge, wherein detecting the data transition comprises generating a pulse of a specific pulse width when the transition is detected and comparing the generated pulse with the first detector pulse to determine that the data transition occurred after the trailing edge.

2. The method of claim 1, further comprising:
receiving a second start signal at the memory;
generating a second detector pulse having a leading edge and a trailing edge in response to the second start signal;
detecting a data transition of the bit associated with the address; and
determining whether the bit is a weak bit by determining whether the data transition occurred after the trailing edge of the second detector pulse, wherein the time interval between the start signal and the trailing edge of the first detector pulse is different from the time interval between the second start signal and the trailing edge of the second detector pulse.

3. The method of claim 1, further comprising:
receiving a second address and a second start signal at the memory;
generating a second detector pulse having a leading edge and a trailing edge at the test circuit in response to the second start signal;
detecting a data transition of a second bit associated with the second address; and
determining whether the second bit is a weak bit by determining whether the data transition occurred after the trailing edge of the second detector pulse.

4. The method of claim 1, further comprising associating an address in a redundant memory with the address in the memory if a weak bit is identified, wherein associating comprises redirecting all read and write commands directed at the address in the memory to the address in the redundant memory.

5. The method of claim 4, wherein associating comprises pushing the address in the memory onto a FIFO and incrementing a redundant memory counter.

6. The method of claim 4, wherein associating comprises remapping a memory pointer for the address in the memory to an address in the redundant memory.

7. The method of claim 1, further comprising performing a write command on the address with a first delay before the start signal to the memory, wherein no other read or write commands are performed on the memory between performing the write command and supplying the start signal.

8. The method of claim 1, wherein generating the pulse of the specific pulse width when the transition is detected comprises generating the pulse at a dual edge pulse generation circuit, and wherein comparing the generated pulse comprises receiving the pulse from the dual edge pulse generator at an AND gate along with the first detector pulse and outputting a digital signal indicative of whether the bit is the weak bit, and storing the digital signal in a flip-flop coupled to an output of the AND gate.

9. A circuit comprising:
a transition detector circuit configured to be coupled to a data output bus of a memory, wherein the transition detector circuit is configured to detect a transition on any data output bit of the data output bus; and
a clock generator circuit configured to provide a plurality of pulses of different pulse width to the transition detector circuit, wherein the transition detector circuit is further configured to provide a first output signal corresponding to a specific data output bit when a transition is detected on the specific data output bit after a pulse provided by the clock generator circuit, wherein the transition detector circuit comprises pulse generator circuits, each of the pulse generator circuits coupled to a data output bit of the data output bus and having a pulse output, wherein each of the pulse generator circuits is configured to generate a pulse at the pulse output when a transition is detected.

10. The circuit of claim 9, wherein the transition detector is further configured to provide a second output signal corresponding to a specific data output bit when a transition is detected on the specific data output bit during the pulse provided by the clock generator circuit, wherein the second output signal is different from the first output signal.

11. The circuit of claim 9, wherein the transition detector further comprises:
synchronous logic memory units configured to provide the first output signal; and
a transition circuit coupled between the pulse outputs, the clock generator circuit, and the synchronous logic memory units, the transition circuit configured to provide signals to the synchronous logic memory units corresponding to detected transitions on specific data output bits during the pulse provided by the clock generator circuit.

12. The circuit of claim 11, further comprising a comparison circuit coupled to outputs of the synchronous logic memory units, the comparison circuit configured to output a flag signal indicating a weak bit at a current read address within the memory.

13. The circuit of claim 12, wherein the comparison circuit comprises a AND gate.

14. The circuit of claim 11, wherein the transition circuit comprises a plurality of AND gates.

15. The circuit of claim 9, further comprising a control unit configured to:
provide control signals to the transition detector and the clock generator circuit; and
receive output data from the transition detector and the clock generator circuit.

16. The circuit of claim 15, further comprising the memory.

17. The circuit of claim 15, further comprising a redundant memory coupled to the control unit.

18. The circuit of claim 15, wherein a control signal from the control unit selects which pulse to provide to the transition detector.

19. The circuit of claim 9, wherein the transition detector circuit further comprises AND gates, wherein each of the AND gates comprises a first input coupled to the pulse output of each of the pulse generator circuits and a second input coupled to the clock generator circuit and flip-flops, wherein each of the flip-flops is coupled to an output of the AND gates and having an output indicative of whether the bit is a weak bit.

20. A method for testing a memory, the method comprising:
providing a first memory clock edge to the memory, wherein the first memory clock edge causes the memory to start writing a data value at a write address within the memory;
generating a first pulse having a leading edge and a trailing edge in response to the first memory clock edge;
providing a second memory clock edge to the memory after the trailing edge, wherein the second memory clock edge causes the memory to start reading the data value from the write address within the memory; and
identifying a weak bit at the write address after reading the data value from the write address, wherein the method for testing the memory comprises a sequence comprising the writing of the data value followed by the reading of the data value and followed by the identifying the weak bit, wherein identifying the weak bit comprises
generating a second pulse having a leading edge and a trailing edge in response to the second memory clock edge,
detecting a data transition of the bit associated with the write address, and
determining whether the data transition occurred after the trailing edge of the second pulse, wherein the determining comprises generating a pulse of a specific pulse width when the data transition is detected and comparing the generated pulse with the second pulse to determine that the data transition occurred after the trailing edge of the second pulse.

21. The method of claim 20, further comprising assigning an address in a redundant memory to function in place of the write address in the memory if a weak bit is identified.

22. The method of claim 20, further comprising repeating the steps of generating, detecting, and determining with a third pulse having a leading edge and a trailing edge, wherein the time interval between the leading and the trailing edges of the second pulse is different from the leading and the trailing edges of the third pulse.

23. The method of claim 20, wherein the method is repeated with a new write address for every address in the memory.

24. The method of claim 20, wherein reading the data value from the write address within the memory causes the data value to change.

25. A method for identifying at least one weakest bit of a plurality of weak bits in a memory, the method comprising:
    providing the memory comprising functional bits and nonfunctional bits, the functional bits comprising the plurality of weak bits;
    applying a first plurality of pulses having a first pulse width to consecutively perform a test operation on each address in the memory and identifying an address in the memory with at least one first weak bit of the plurality of weak bits, wherein the test operation identifies an address as having the at least one first weak bit based on whether a data transition on an output of the memory is detected during a read operation after the duration of the first pulse width, wherein detecting the data transition comprises generating a pulse of a specific pulse width when the transition is detected and comparing the generated pulse with the first pulse width to determine that the data transition occurred after the duration of the first pulse width;
    applying a second plurality of pulses having a second pulse width to consecutively perform the test operation on each address in the memory and identifying an address in the memory with at least one second weak bit of the plurality of weak bits, wherein the test operation identifies an address as having the at least one second weak bit based on whether a data transition on an output of the memory is detected during a read operation after the duration of the second pulse width; and
    identifying the at least one weakest bit from the at least one first weak bit, wherein the first pulse width is longer than the second pulse width, wherein the test operation comprises a read-after-write test.

26. The method of claim 25, wherein identifying the at least one weakest bit comprises identifying a single weak bit.

27. The method of claim 25, further comprising remapping the address with the at least one weakest bit in the memory to a redundant memory.

28. The method of claim 27, after remapping the address with the at least one weakest bit in the memory to the redundant memory, the method further comprising:
    applying a third plurality of pulses having a third pulse width to consecutively perform the test operation on each address in the memory and identifying an address in the memory with at least one third weak bit of the plurality of weak bits, wherein the test operation identifies an address as having the at least one third weak bit based on whether a data transition on an output of the memory is detected during a read operation after the duration of the third pulse width;
    applying a fourth plurality of pulses having a fourth pulse width to consecutively perform the test operation on each address in the memory and identifying an address in the memory with at least one fourth weak bit of the plurality of weak bits, wherein the test operation identifies an address as having the at least one fourth weak bit based on whether a data transition on an output of the memory is detected during a read operation after the duration of the fourth pulse width; and
    identifying at least one additional weakest bit from the at least one third weak bit, wherein the third pulse width is longer than the fourth pulse width.

* * * * *